United States Patent [19]

Weikel

[11] Patent Number: 4,652,855
[45] Date of Patent: Mar. 24, 1987

[54] PORTABLE REMOTE METER READING APPARATUS

[75] Inventor: Scott J. Weikel, Raleigh, N.C.

[73] Assignee: Westinghouse Electric Corp., Pittsburgh, Pa.

[21] Appl. No.: 678,190

[22] Filed: Dec. 5, 1984

[51] Int. Cl.⁴ .......................................... H04M 11/04
[52] U.S. Cl. ............................ 340/310 A; 340/870.02
[58] Field of Search .......... 340/310 A, 310 R, 825.06, 340/870.02; 179/2 AM

[56] References Cited

U.S. PATENT DOCUMENTS

| | | | |
|---|---|---|---|
| 3,702,460 | 11/1972 | Blose | 340/310 A |
| 4,119,948 | 10/1978 | Ward et al. | 340/310 A |
| 4,169,290 | 9/1979 | Reed | 179/2 AM |
| 4,357,598 | 11/1982 | Melvin, Jr. | 340/310 A |
| 4,463,354 | 7/1984 | Seas | 340/870.02 |

Primary Examiner—Douglas W. Olms
Assistant Examiner—Curtis Kuntz
Attorney, Agent, or Firm—B. R. Studebaker

[57] ABSTRACT

A portable remote meter reading apparatus is provided which communicates, via a power line conductor, with remote inaccessible electrical meters. A keyboard is provided to enable an operator to enter command and address information to identify a unique inaccessible meter. A baseband data message is formulated to include the unique address and command information. After being modulated with the high frequency carrier signal, the baseband data message is amplified and injected onto the power line conductor for receipt by a remote meter that is equipped with a transmitter and receiver. In response to the command message, the remote meter transmits electrical energy information for receipt by the present invention. The present invention incorporates receiver circuitry which filters lower frequencies from the incoming sinusoidal signal and hard limits the signal to provide a rectangular wave signal to a microprocessor which is capable of demodulating the signal and converting the incoming information into usable energy units, such as kilowatthours, for display on a visual display. Portable direct current power is provided in order to enable the present invention to be completely portable and not depend on the provision of power from external sources.

5 Claims, 8 Drawing Figures

PORTABLE REMOTE METER READING APPARATUS

BACKGROUND AND SUMMARY OF THE INVENTION

The present invention relates generally to power line communication systems and, more specifically, to portable meter reading apparatus that is able to be connected to the power line at a location that is remote from the meter that is to be read.

For many years, electric utility companies have measured the consumption of electrical energy, by their customers, with the use of electromechanical kilowatthour meters. A typical kilowatthour meter contains a plurality of dial indicators that represent the digits of a cumulative electrical energy consumption for the residence to which the meter is connected. In order to determine the monthly energy usage for each of the utilities' customers, the cumulative value of electrical energy consumption represented by the meter register is manually read and recorded on a monthly or bi-monthly basis. The energy used during the billing period can then easily be determined by comparing the cumulative values for successive periods. This type of meter reading operation is generally performed by an employee of the electric utility who goes from house to house along a prescribed route and manually records all of the cumulative meter readings.

Although the manual reading of meters, as described above, has been used for many years, it presents serious difficulties and disadvantages under certain circumstances. For example, many utilities have experienced a problem in situations where one of their energy consumers has placed a fence, or other obstacle, in a position that prevents a meter reader from gaining access to the electric meter. Although fence-like obstacles are the clearest example of this type of situation, this type of difficulty can also be caused in locations where the electric meter is placed inside the residence and access to the residence is unavailable. For example, when many dwellings are built side-by-side, such as row house configurations, the electric meters are generally placed inside the dwellings and access to the meters depends on the presence of the home owner at the time the meter reader arrives.

One possible solution to the problem described above is to incorporate a power line carrier communication system in which the electric utility provides two-way communication devices at each electrical meter, within the consumer's residences, and uses a central station that communicates along the power line system to automatically read the kilowatthour values for each consumer. This type of system avoids the necessity of having a meter reader physically go to the house of the consumer to read the meter. However, for many electric utilities, the expense of this type of system cannot be justified by the relatively small percentage of meters that present the difficulties described above.

For an electric utility that has a large number of electric meters that are manually read and a relatively small percentage of those meters which are difficult to read because of various type of obstacles, it would be advantageous to provide a means for the meter reader to remotely read the meters at the residences where difficulties exist. It would be further advantageous if this type of remote meter reading apparatus did not require the central station transceiver, the repeaters, or the other equipment normally required in a complete power line carrier communication system.

The present invention incorporates the use of a portable remote meter reading apparatus which can be connected in signal communication with the power line which is in electrical communication with the residence at which the inaccessible electric meter is located. If the inaccessible consumer residence has been provided with a two-way communication device associated with its electric meter, the meter reader can utilize the present invention to command the two-way device to transmit its electric energy consumption information. When a meter reader uses the present invention, a fully equipped power line communication system is not required. Neither the central station transmitter nor the numerous repeaters and other transmission equipment are utilized by the present invention. All communications are between the meter at the consumer residence and the portable meter reading apparatus which is connected to the transmission line at a remote location that is not too distant from the inaccessible residence. In a typical application of the present invention, the portable remote meter reading apparatus is connected to the power line at the utility pole which is nearest the residence. Various alternative embodiments of the present invention utilize different connection techniques. For example, a female receptacle can be provided at the utility pole. This female receptacle would be connected in electrical communication with the customer's power line in order to provide a direct 120 volt connection between the female receptacle and secondary winding of the customer's distribution transformer. Alternatively, the present invention can be magnetically coupled to a ground wire connected to the distribution transformer. In situations where these two methods of connection are impractical, the present invention can be connected in electrical communication with a female receptacle at a neighboring residence. If the neighboring residence is connected to the same distribution transformer as the inaccessible meter, the present invention will provide power line communication between the portable remote meter reading apparatus and the inaccessible electric meter. Each of these alternative connections could utilize differently configured connection apparatus.

The present invention comprises a means for formulating a baseband signal that is representative of a manually entered command message. In a typical application of the present invention, a command message would contain operative instructions that command a remote meter to subsequently transmit information relating to its stored energy consumption information. Any one of a variety of different coding techniques can be used for formulate the baseband signal. The baseband signal comprises a plurality of bits that contain a numeric representation of the command message. The present invention also provides a means for modulating a carrier signal with the baseband signal. In a preferred embodiment of the present invention, a high frequency carrier signal is used. Although many different frequencies can be used, it has been found that a frequency of 12.5 kilohertz is suitable for this purpose. The modulation is accomplished by utilizing an exclusive-OR device having two imputs. One input is connected to a carrier generator that is capable of providing a continual stream of pulses at the prescribed frequency. The second input of the exclusive-OR device is connected to the source of the baseband signal. The modulated signal is then amplified for the purpose of injecting the modulated signal onto a conductor of a power line. For example, U.S. Pat. No. 4,467,314, which issued on Aug. 21, 1984 to Weikel et al., discloses a power line carrier communications system that includes a combination field configuration and test device that can be plugged into a load management terminal. This patent describes a terminal that is coupled to the power line through connection to the load management terminal for the purpose of generating a set of test commands which are transmitted over the power line for execution by the connected load management terminal. U.S. Pat. No. 4,065,763, which issued on Dec. 27, 1977 to Whyte et al., discloses a distribution network power line communication system that includes a coupling means for applying a carrier current communication signal to the polyphase primary distribution conductors with a proportional relationship between the signal voltages applied to the various conductors selected to provide a predetermined propagation mode.

The present invention also comprises a receiver circuit that is connectable in signal communication with the power line conductor. The receiver circuit contains a high pass filter that is capable of removing low frequency signals, such as the power transmission 60 Hz. waveform, from incoming messages received from the power line conductor. The receiver circuit also hard limits the incoming sinusoidal signals in order to provide a generally square, or rectangular, waveform. The hard limited signal is then sent to a demodulator that is connected in signal communication with the receiver circuit. The purpose of the demodulator is to demodulate the incoming sinusoidal signals and provide an incoming baseband signal which contains information representative of energy consumption that had been transmitted by a remote meter. Many different types of receiver circuits are known to those skilled in the art. For example, U.S. Pat. No. 4,382,248, which issued on May 3, 1983 to Pai, discloses a device for receiving communication signals carried by the phase conductors of a multi-phase power distribution network communication system. It includes a circuit for independently receiving each of the communication signals carried by the phase conductors. Although this patent specifically deals with receiving signals from three phases of a three phase power line system, it discusses known technology generally related to receiving signals from power line conductors.

Various types of demodulators are known to those skilled in the art of power line communication systems. For example, in a power line communication system that utilizes phase shift keyed (PSK) modulation techniques, a demodulator such as the one described in U.S. Pat. No. 4,311,964, which issued on Jan. 19, 1982 to Boykin, can be used. This patent describes an apparatus and method for coherent phase shift keyed demodulation of a binary phase shift keyed carrier. It sequentially processes plus and minus polarity samples of a plurality of carrier segments that occur within each carrier data symbol. The samples for each segment provide a binary coded signal for producing corresponding first and second relative phase angle vector signals. An improved coherent phase shift keyed demodulator is disclosed in U.S. Pat. No. 4,379,284, which issued on Apr. 5, 1983 to Boykin. This patent discloses an apparatus and method for coherent phase demodulation of a binary phase shift keyed carrier signal that is representative of the kinds of demodulators that can be used in conjunction with the present invention.

The present invention also comprises a means for translating the incoming baseband signal, after it is demodulated, into a value representative of energy consumption. Many different coding techniques can be used to numerically represent incoming information. The translating means of the present invention merely serves the function of converting the incoming digital signal into usable information. Part of this function is the conversion from pulse counts to kilowatthours or some other energy consumption value. Normally, this conversion can be accomplished by multiplying a pulse count value by a suitable conversion constant.

Electric meters that are capable of storing energy consumption data are typically configured with some type of pulse initiator or register dial encoding device. For example, U.S. Pat. No. 4,077,061, which issued on Feb. 28, 1978 to Johnston et al., discloses a metering system for electric utility power line measurements that includes voltage and current signal inputs that are sampled and converted to binary representations. It utilizes a sequence controller and calculator that provide programmed control for processing digital control and data signals and for producing digital calculations of electrical energy parameters from the binary representations of the instantaneous signal values. It utilizes memory registers to totalize and accumulate digitally calculated values for producing visual displays and output signals that corresponding to electrical energy parameters to be measured. U.S. Pat. No. 4,034,292, which issued on July 5, 1977 to McClelland, discloses an opto-electronic pulse initiator for producing meter data pulses from a meter having a rotating movement. A directionally oriented pattern containing at least two reflective surfaces is driven by the meter movement to sequentially activate first and second optical sensors. The optical sensors are connected to the inputs of a bistable logic circuit in order to produce predetermined mutually opposite binary logic states at the outputs of the bistable circuit with the logic states corresponding to a given direction of meter movement. Data pulse output channels are controlled by the bistable logic circuit to selectively produce meter data pulses for a predetermined direction of rotation of the meter movement. U.S. Pat. No. 4,439,764, which issued on Mar. 27, 1984 to York et al. discloses a remote meter reading system that includes a dial register encoder and a pulse encoder which are both coupled to the same rotary disc of an induction watthour meter. A first electronic data register stores the non-volatile dial register encoder output and a second electronic data register stores a value consisting of an initial value set by the dial register encoder at start-up time continuously augmented by the output of the pulse encoder since the start-up. Comparison and selective read-out of the two electronic data registers reduces erroneous meter reading outputs.

In situations where pulse initiators are utilized to measure energy consumption, the pulses generally represent revolutions of a meter disc. Although this type of value is directly representative of energy consumption, it must be multiplied by some predetermined constant value in order to convert it to readily usable units, such as kilowatthours. Therefore, the present invention incorporates programming means for translating the incoming baseband signal into a representative value in units which are easily understandable by a meter reader utilizing the present invention.

Field configuration terminals, such as the one described above in conjunction with the U.S. Pat. No. 4,467,314, are used in cooperation with a power line carrier communication system that involves an electric utility's entire distribution system. In such a system, the electric utility employs a central station that is capable of transmitting and receiving signals between many remote terminals located at consumers' residences. At various points within the transmission system, repeaters are used in order to amplify the signals transmitted between remote devices. When a field configuration terminal is used in conjunction with a specific load management terminal, or electric meter with transceiver capabilities, it is generally coupled directly to the terminal. In this way, the load management terminal can easily transmit and receive messages between it and the load management terminal, or meter, and this direct connection between the load management terminal (LMT) and the field configuration terminal (FCT) is also utilized to provide electrical power for the operation of the portable load management terminal. This convenience eliminates any need for using portable sources of electrical power. However, in order to achieve this convenience, the field configuration terminal must be coupled directly to the load management terminal, or meter, and this requires easy accessibility of the electrical meter. However, as discussed above, electric utilities experience many situations in which the meter is not accessible. Therefore, conventional field configuration terminals cannot be used because of the requirement of direct connection to the meter. The present invention avoids this disadvantage by providing a portable source of DC power for its meter reading apparatus. In a preferred embodiment of the present invention, this DC power is provided by a battery. The battery is used to provide power for the microprocessor, amplifier, display and other electronic components within the present invention.

In order to provide a solution for the problems described above, the present invention is portable so that it can be carried by a meter reader to a location that, although being remote from the meter to be read, permits the present invention to be connected to a conductor or ground wire of a power line system that is connected in signal communication with the meter. A portable source of direct current power is provided, generally in the form of a battery, in order to permit the present invention to be independent of the need for external power sources. A transmitter and a receiver are provided in the present invention to enable it to transmit and receive modulated signals, between it and a remote meter, along the power line conductor. A modulator and a demodulator are provided to accomplish conversion between baseband data messages and phase shift keyed modulated signals. A keyboard is provided to permit an operator to enter a command message into the present invention for subsequent formulation, into baseband data, and modulation prior to being injected onto the power line conductor. Receiver circuitry is provided to filter out low frequency waveforms from the incoming signal and to hard limit the incoming sinusoidal signal to provide a rectangular waveform to the demodulator of the present invention. After demodulation, the incoming signal is converted to usable units, such as kilowatthours, and displayed on a display for manual interpretation and recording of the information. The present invention is contained within a housing member which can be carried by the meter reader.

BRIEF DESCRIPTION OF THE DRAWINGS

The present invention will be more clearly understood from a reading of the description of the preferred embodiment in conjunction with the figure, in which.

DESCRIPTION OF THE PREFERRED EMBODIMENT

Throughout the description of the preferred embodiment, identical reference numerals will be used to illustrate like components.

Figure 1:
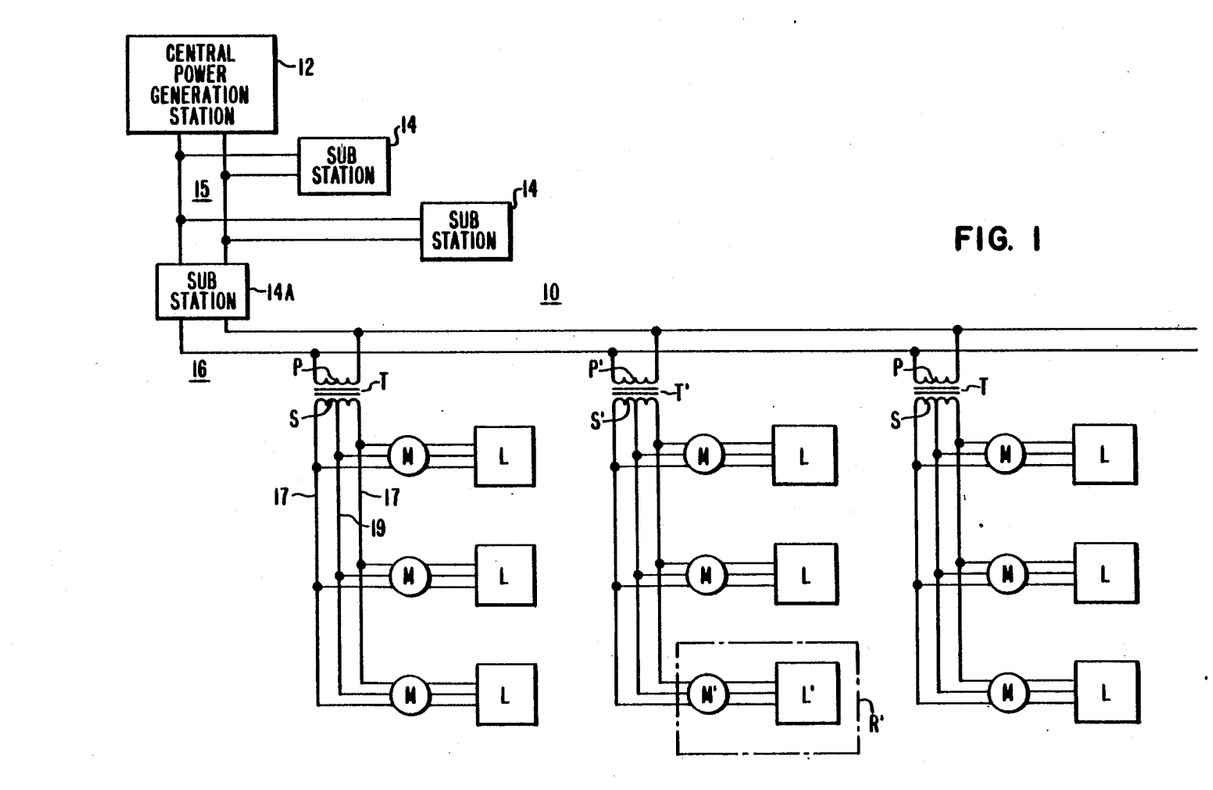
FIG. 1 illustrates a schematic diagram of a typical power distribution system.

FIG. 1 illustrates a typical power line distribution system 10 in which a central power generation station 12 provides electrical power to a plurality of substations 14. Each substation 14 is connected to the central power generation station 12 by power transmission lines 15. Each substation 14 is also connected to a plurality of distribution transformers T by distribution lines 16. In a typical application, the distribution lines 16 would carry power at approximately 7.2 kilovolts, to the distribution transformers T and the power transmission lines 15 would be at a much higher voltage, such as 100 kilovolts or more. For illustration purposes, only one substation 14a is shown with its corresponding distribution line 16 and plurality of distribution transformers T.

Each of the distribution transformers T is associated with the power line distribution system with its primary winding P connected to the power distribution line 16 and its secondary winding S connected to one or more electrical loads L. It should be understood that the loads L represent all of the electrical energy consuming devices at a particular location, such as a customer's residence. Between the secondary winding S of each distribution transformer T and each load L, a meter M is connected. The function of the meter M is to measure the electrical energy consumed by its corresponding load L. Each of the loads L in FIG. 1 can be considered to represent an individual consumer's residence.

In a typical electric utility power transmission system, which does not incorporate a power line communication system, each of the meters M would be manually read by a meter reader at predetermined intervals, such as once a month. Each reading of the meters M defines a billing period and the amount of electrical energy consumed by each resident for that billing period is determined by subtracting the cumulative energy usage of the previous billing period from the cumulative energy usage of the present billing period. Many electric utilities throughout the country utilize this type of system where manual readings are made periodically to determine the electrical energy consumed by each customer and to bill that customer accordingly based on a predetermined cost per kilowatthour.

A problem can occur when one or more of the utility customers presents a situation in which the consumers' meter M is not easily read manually. For example, referring again to FIG. 1, if one of the electric meters M' is located at a residence R' in which the meter M' is not easily accessible to the meter reader, performance of the periodic meter reading can become excessively difficult. For example, if the residence R' has an indoor meter M', or has a fence which precludes the meter reader from gaining access to the meter M', some other means must be used to achieve the periodic meter reading that is required for proper billing.

One possible solution to the problem described above is to provide a power line communication system in which all of the meters of the electric utility system are read automatically. However, if only a small number of the meters M of an electric utility power line system are unaccessible, the incorporation of a complete power line communication system can be excessive and inappropriate to solve this problem. As in the case of FIG. 1, a large proportion of the loads L are easily read by manual means and only a small proportion (residence R') is unable to be read by these methods. Therefore, it would be helpful if some means can be provided to automatically read the inaccessible meter M' without the necessity of incorporating a complete power line communication system.

In order to provide this ability to remotely read the inaccessible meter M', the present invention provides a portable and remote meter reading apparatus that can be connected in electrical and signal communication with the remote meter M'. The present invention provides a transceiver that can be connected in signal communication with the secondary winding S' of the transformer T'. If a two-way communication device is provided in association with the inaccessible meter M', the present invention can communicate, via the power line system, between the transformer T' and the inaccessible meter M', command the meter M' to transmit a signal representative of its electrical energy consumption to date and receive that signal. After reception of the return signal by the present invention, the message can be decoded and converted to units which are easily understandable by the meter reader. As can be seen in FIG. 1, each of the loads L is connected to the secondary winding S of a transformer T in a three-wire configuration. This configuration comprises two "hot" wires 17 and a neutral conductor 19. It should be understood that each transformer T would also be provided with a ground wire although this connection is not illustrated in detail in FIG. 1.

Figure 4:
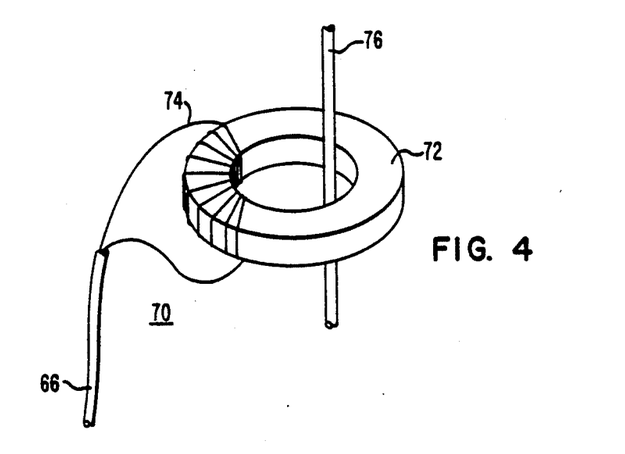
FIGS. 4 and 5 illustrates alternative embodiments of the connecting means between the present invention and the power line conductor.
Figure 5:
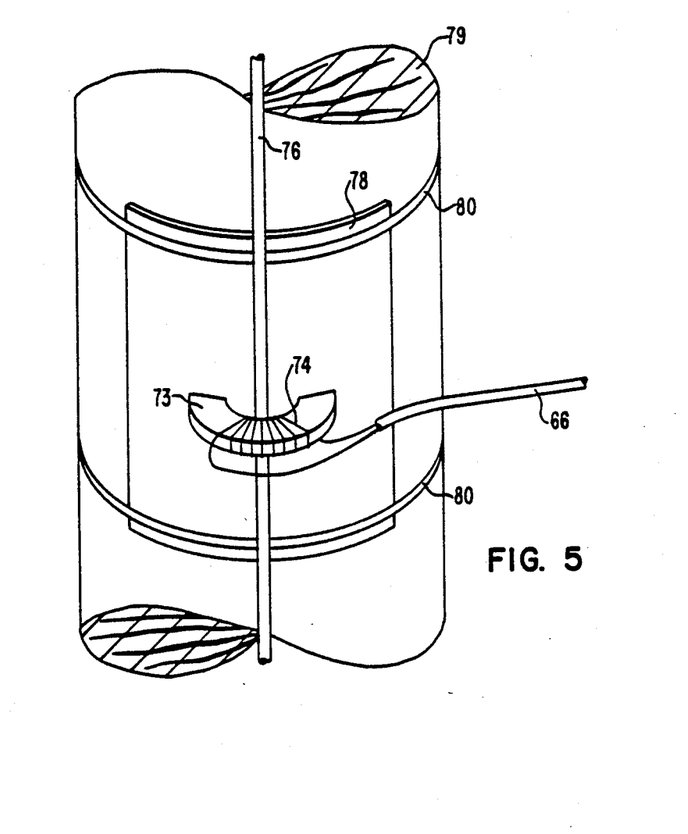

The present invention can be connected to the power transmission system at various locations and in various ways. For example, one possible way of connecting the present invention to the power line system is to provide an electrical receptacle proximate the distribution transformer T'. The electrical receptacle can be of a conventional female type that is protectable from tampering. The present invention would then be provided with a conventional male electrical plug that can be associated with the protectable receptacle and communication connection can then be made available by inserting the plug into the receptacle. Alternatively, the present invention can be provided with a specially designed connector that enables it to be magnetically coupled to the ground wire of the distribution transformer T'. This specially designed connector, which will be discussed in greater detail below in conjunction with FIGS. 4 and 5, provides magnetic coupling between the remote meter reading apparatus of the present invention and the inaccessible meter M'. Another possible way of connecting the present invention to the power line is to plug a male connector of the present invention into an electrical receptacle of a neighboring consumer's residence. This can be accomplished while the meter reader is at the neighboring consumer's residence for purposes of reading that consumer's meter. If an outside receptacle is available at the neighboring residence, the meter reader can simply insert the male plug of the present invention into the female receptacle at the neighbor's residence and provide signal communication between the present invention and the inaccessible meter M'. This technique is especially suitable when the neighboring residence is connected to the same secondary S' as the inaccessible meter M'.

Figure 2:
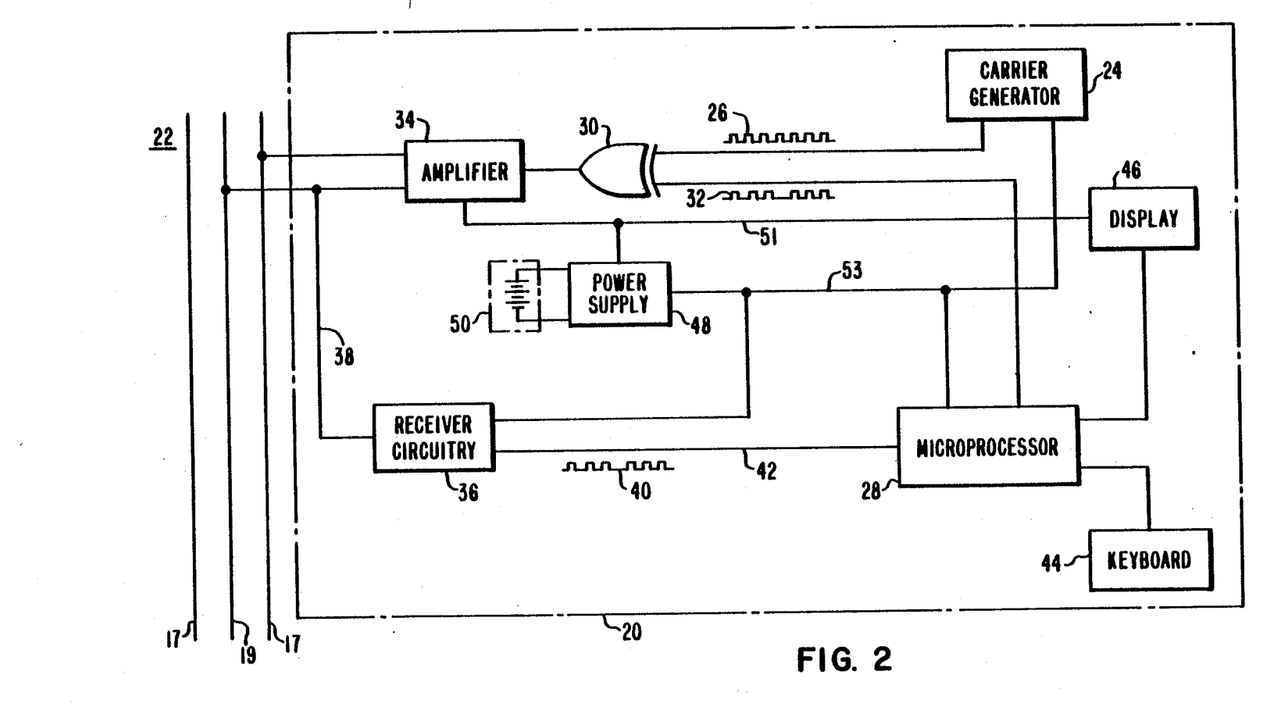
FIG. 2 illustrates an electrical schematic of the present invention.

The present invention is illustrated in FIG. 2. The portable remote meter reading apparatus 20 of the present invention comprises a means for modulating a baseband data message and injecting it onto a power line system 22. Although the meter reading apparatus 20 is shown in FIG. 2 as being connected directly to the power lines, the present invention is not so limited and other alternative connection procedures will be discussed below. In order to modulate a baseband data message, a carrier generator 24 is provided which is capable of generating a continual stream 26 of high frequency pulses having a constant and known frequency. In a preferred embodiment of the present invention, a frequency of 12.5 kilohertz is used. However, it should be understood that other alternate frequencies can be used within the scope of the present invention. A microprocessor 28 is used to formulate a baseband data message containing a command message and transmit this baseband data signal to one of the inputs of a modulator 30, which is an exclusive-OR device. The baseband data signal 32 and the carrier signal 26 are connected to the inputs of the modulator 30, as shown in FIG. 2, and a phase shift keyed (PSK) modulated signal is output by the modulator 30 to an amplifier 34 which amplifies the modulated signal and injects it onto the power line system 22. In a preferred embodiment of the present invention, a microprocessor of the 6800 series which is available from the Motorola Corporation is utilized to formulate command messages and demodulate incoming signals.

It should be understood that the baseband data message 32 would represent a command that, when received by a remote device, would cause the remote device to transmit its energy consumption information onto the power line system 22. Although other messages are possible, the primary function of the present invention is to command remote meters to transmit their energy, or power, usage information back to the portable remote meter reader 20. The present invention can also be used to retrieve demand data (i.e. kw) from the remote meter.

In order to receive signals from remote meters, the present invention incorporates receiver circuitry 36 which is connected in signal communication with the power line 22 as shown in FIG. 2. The receiver circuitry comprises a high pass filter that removes lower frequencies from the incoming signal. The lower frequencies which are removed consists of the power transmission frequency of 60 Hz. and other frequencies which are significantly below the 12.5 kilohertz frequency of the carrier signal. It should be understood that the signals received by the receiver circuitry 36, on line 38, consists of the modulated incoming message along with the 60 Hz. power transmission frequency and other spurious signals caused by electrical noise. After the lower frequencies are filtered from the incoming sinusoidal signal, the remaining signal is hard limited to provide a rectangular waveform 40 that contains the modulated baseband data message. This resulting signal is transmitted to the microprocessor 28, on line 42, for demodulation.

Within the microprocessor 28, appropriate programs are incorporated which demodulate the incoming signal 40 in order to determine the contents of the incoming baseband data message. This message is then translated into a usable format. Any one of a number of known coding techniques can be used within the scope of the present invention to encode both outgoing and incoming messages in a digital format that represents specific commands or data information.

The present invention also provides a keyboard 44 which permits an operator to enter information relating to the unique remote meter. The types of information that the operator would enter by the keyboard comprise unique address information to identify the remote meter and information relating to the specific type of command that the operator wishes to transmit to the remote meter. The command configuration utilized by the present invention incorporates a unique address that identifies a particular meter. It also can include a message that commands a particular response, such as a return transmission including the kilowatt-hour reading of the meter. As described above, the most common command that will be entered by the keyboard 44 is a command that requests the remote meter to transmit its stored electrical energy information onto the power line 22 for reception by the receiver circuitry 36. In a preferred embodiment of the present invention, the keyboard 44 is Style No. 88-YY-3613B-500, which is manufactured by the Grayhill Corporation.

A display 46 is provided so that the microprocessor 28 can visually indicate the received energy consumption information to the operator. The most common type of information that will be displayed on the display 46 of the present invention will relate to energy consumption information received from the remote meter. In a preferred embodiment of the present invention, the display 46 is Style No. DL-704, made by the Litronix Corporation.

Between the reception of the modulated signal 40 and the display of the data on the display 46, the microprocessor 28 not only demodulates the incoming message, but also performs a conversion from pulse counts to usable units of electrical consumption. Since, in all likelihood, the remote meter would store the electrical energy consumption information as a number of pulses representing a number of revolutions of its disc, this information is not directly usable by the operator. Therefore, the microprocessor 28 multiplies the pulse count value by an appropriate conversion factor in order to determine the electrical energy usage in a usable format, such as kilowatthours, for illustration to the operator on display 46.

In known types of transceivers usable with power line communication devices, power is provided by connecting the device directly to the power line system and obtaining AC electrical power therefrom. Normally, this AC power is converted to DC by using known rectifying techniques. In order to make the present invention truly portable and not dependent on an external source of power, a power supply 48 is provided which is designed to be associated directly with a portable DC power source, such as the battery 50. In a preferred embodiment of the present invention, the battery 50 is a nickel cadmium battery with a rating of 1.2 ampere hours and 12 volts. This type of battery can be obtained from many manufacturers, but in the preferred embodiment of the present invention, the battery is provided by the General Electric Corporation as model number 41B030BA02301. The battery 50 is connected to power supply circuitry 48 which is configured to provide both 12-volt and 5-volt power to the components of the present invention. As shown in FIG. 2, line 51 connects the power supply 48 with the amplifier 34 and display 46. Line 51 provides 12-volt power to these components. As can also be seen in FIG. 2, line 53 connects the power supply 48 with the receiver circuitry 36, the microprocessor 28 and the carrier generator 24. Line 53 provides 5-volt power for these components.

Therefore, although the present invention can be directly connected to the power line conductors for purposes of injecting a signal thereon or receiving a signal therefrom, the present invention does not depend upon the power line for its power. This enables the present invention to be connected in signal communication with the neutral or ground connection of a distribution transformer and greatly improve its portability by removing the necessity of connection to a source of alternating current.

Figure 3:
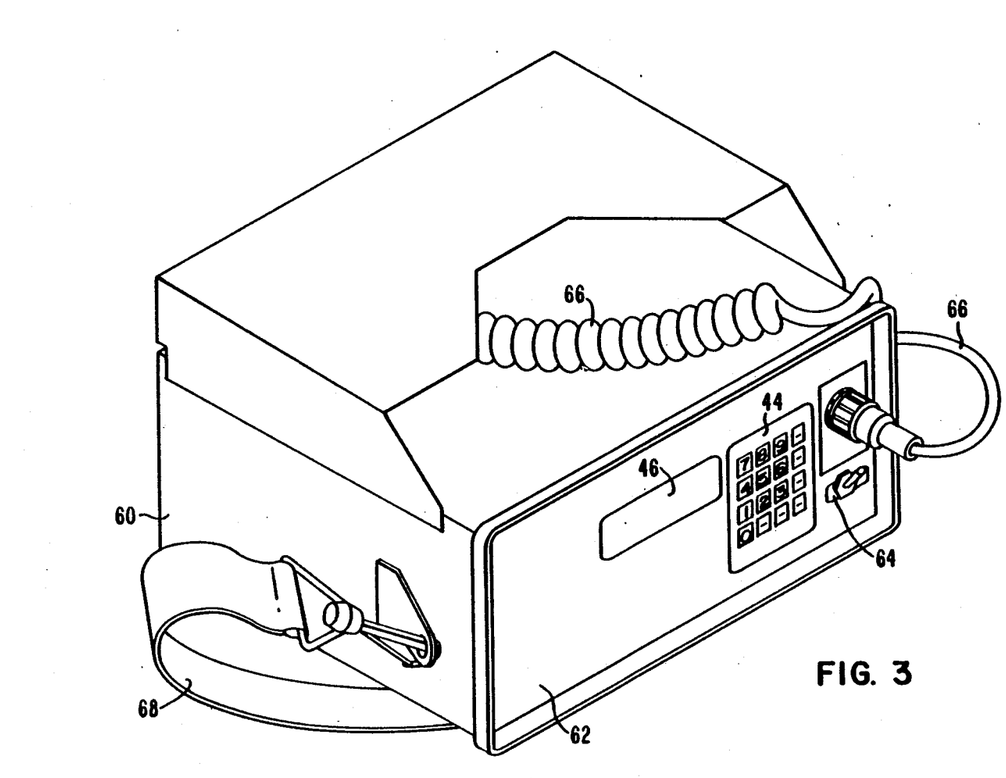
FIG. 3 illustrates an isometric view of the portable meter reading apparatus provided by the present invention.

FIG. 3 represents a possible physical configuration of the present invention. It is provided with a housing member 60 which provides protection and support for the components of the present invention. A front panel 62 is illustrated in FIG. 3 as having the keyboard 44 and display 46 connected thereto. Also shown in FIG. 3, is an on-off switch 64 which can be used to preserve the battery 50 when the present invention is not in use. A connector cable 66 is shown extending from the front panel 62. It should be understood that the connector cable 66 is connected in electrical and signal communication with both the amplifier 34 and the receiver circuitry 36 which are illustrated in FIG. 2. As can be seen in FIG. 3, this configuration of the present invention provides a portable device which can be carried by an operator to any one of a variety of locations where the connector cable 66 can be connected to a conductor of the power line. Also illustrated in FIG. 3 is a carrying strap 68 which improves the portability of the present invention.

As described above, various different types of connectors can be provided for use with the present invention. The most common type of connector is a standard male plug that can be used with any typical female receptacle. This type of connection provides signal communication between the present invention and a power line system. As discussed above, a standard male plug, connected to the distal end of cable 66, can be used in conjunction with a female receptacle connected to the secondary of the distribution transformer on the utility pole or a female receptacle location at a neighboring residence.

An alternative means for connecting the present invention in signal communication with the power line is illustrated in FIG. 4. It comprises a toroid-shaped ferrite core 72 with a plurality of turns 74 wound around it. The plurality of turns 74 are connected in electrical communication with the wires of the cable 66 which is connected to the present invention. The toroid 72 can then be placed around the ground wire 76 which is connected between the transformer T and ground. During transmission from the present invention, the outgoing signal is therefore magnetically coupled to the ground wire 76. As will be discussed in greater detail below, the ground wire 76 is connected to the distribution transformer T and the high frequency signal is transmitted to the secondary winding S and power lines connected to the inaccessible meter M'.

Although the configuration illustrated in FIG. 4 is exemplary of this particular type of connection, a more practical configuration is illustrated in FIG. 5. Since the ends of the ground wire 76 are permanently attached to both the transformer and the utility pole, the toroid 72 would have to remain attached to the utility pole because of its captive configuration illustrated in FIG. 4. The alternative connector, which is illustrated in FIG. 5, incorporates a ferrite yoke 73 which is not completely toroidal. The yoke 73 is would with a plurality of turns 74 which are connected in electrical communication, by cable 66, to the present invention. It should be apparent that the yoke 73 does not, by itself, provide a complete magnetic path around the ground wire 76. Therefore, a conductive plate 78 is permanently fastened to a utility pole 79 by some means, such as the straps 80. The plate 78 is connected to the utility pole 79 so that it is disposed between the utility pole 79 and the ground wire 76. Therefore, the yoke 73 can be placed over the ground wire 76, as shown in FIG. 5, and a complete magnetic path will be provided by the yoke 73 and plate 78 in order to permit the signal from the present invention to be magnetically coupled to the ground wire 76. The plate 78 would remain as a permanent part of the utility pole 79, but the yoke 73 would remain as a part of the portable meter reading apparatus of the present invention.

Figure 6:
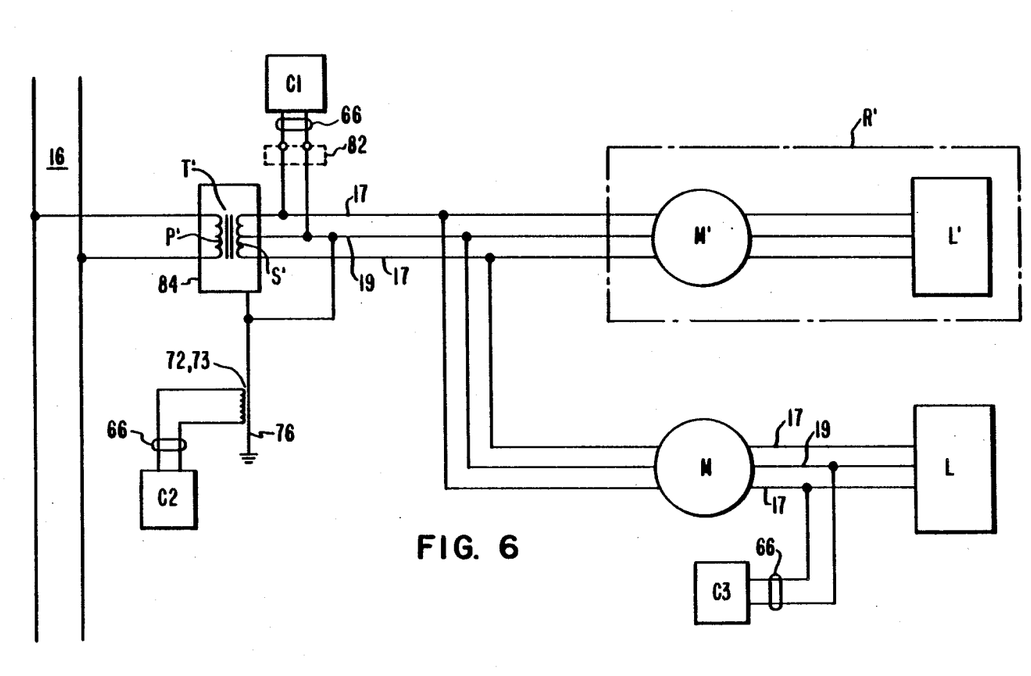
FIG. 6 is an electrical schematic diagram illustrating the various modes of connection between the present invention and a power line distribution system.

FIG. 6 illustrates the various types of connection to a power line system that are made possible by the present invention. The power distribution line 16 is shown connected to the primary P' of a transformer T'. The secondary S' of the transformer T' is connected in a three-wire configuration with two "hot" conductors 17 and a neutral conductor 19. For illustration purposes, two residences are illustrated in FIG. 6. One residence R' is shown having a meter M' which is inaccessible for some reason. Meter M' is connected to a load L' and the inaccessibility of meter M' prevents direct visual observation of the meter M' by a meter reader. A neighboring residence, which is also connected to the secondary S' of the transformer T', contains a load L and a meter M which is easily accessible to the meter reader.

FIG. 6 also illustrates three cases, or situations, C1, C2 and C3, in which the present invention can be applied to provide a reading of the inaccessible meter M'. The first case illustrates the present invention C1 connected to a female receptacle 82 that is, in turn, connected across 120 volts of the three-wire system. In order to provide for this situation, a female receptacle would be connected in electrical communication with the secondary S' of the transformer T' and the receptacle would be located at the utility pole on which the distribution transformer T' is located or on which the wires 17 and 19 are attached. This type of application has certain disadvantages. The connection of a female receptacle to the power line, if not protected, would provide free electrical power to anyone desiring to use it and, more seriously, could present an electrical hazard to the public. Therefore, if a female receptacle 82 is connected to the secondary S' as shown, one of two precautions must be taken. First, the female receptacle 82 could be provided with a tamper-proof convering. Alternatively, the female receptacle 82 could be placed out of reach at a point on the utility pole. However, this precaution presents severe disadvantages since it would require the meter reader to climb the utility pole in order to accomplish the reading of meter M'. Therefore, case 1 would more likely incorporate a tamper-proof cover for the female receptacle 82 which would be placed at a reasonable height on the utility pole to permit the meter reader easy access to it. In case 1, the present invention would be provided with a standard male plug as its connection means connected to the cable 66.

Case 2 C2 utilizes the ground wire 76 which is connected between earth ground and the transformer T'. As discussed above, the present invention would be provided with a ferrite core (reference numerals 72 or 73 in FIGS. 4 or 5) that would permit the present invention to transmit a signal that is magnetically coupled to the ground wire 76. This signal would pass through the ground wire to the transformer T1 and coupled to the secondary S'. This would then permit the present invention to transmit signals to the conductors, 17 and 19, that are in electrical communication with the inaccessible meter M'.

A third case C3 utilizes an available receptacle at a neighboring residence. The receptacle can be an available outdoor receptacle that would, of course, be located with the meter M between it and the distribution transformer T'. The present invention could be connected to the distribution system conductors, as shown, and transmit messages to the inaccessible meter M'. In this application, the present invention would be provided with a standard male plug connected to its cable 66.

Figure 7:
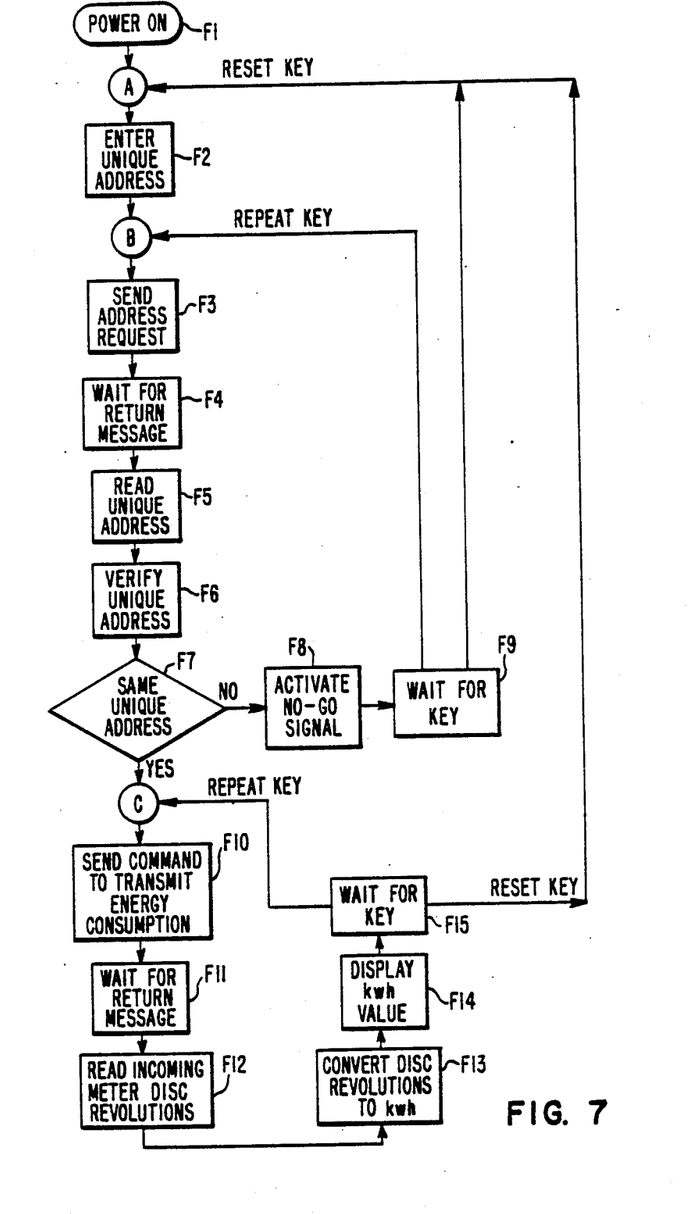
FIG. 7 is a flow chart of the program portions related to the communication between the present invention and a remote electric meter and conversion of incoming signals to usable units.

FIG. 7 illustrates an exemplary flowchart of the program portions within the microprocessor 28 that perform the functions for the proper operation of the present invention. At flowchart block F1, the present invention is turned on by use of the on-off switch 64. At block F2, the microprocessor 28 enters a unique address, received from the keyboard 44, into memory. This unique address represents the address of the remote and inaccessible meter M'. At flowchart block F3, the microprocessor formulates an output message that comprises baseband data which is representative of the unique address of the inaccessible meter M'. This address request is modulated and transmitted onto the power line for receipt by the inaccessible meter M' and any other receiver that is connected in signal communication with the power line system. At block F4, the microprocessor waits for a return message from the inaccessible meter M'. It should be understood that, in certain circumstances, other transmissions will be occurring simultaneously from other devices on the power line system and the present invention would receive all of the transmissions within its range. Therefore, return messages must be interrogated to assure that they are from the same meter M' to which the address request message was sent. When the return message is received, the microprocessor reads its unique address, as indicated by block F5, and verifies that the unique address is the same as the address of the inaccessible meter M' to which the original message was transmitted. The verification is shown in block F6 and the comparison of addresses is illustrated in block F7. If the unique address in the received message is identical to that in the original transmission, the microprocessor proceeds to point C in the flowchart of FIG. 7. If the addresses are not the same, a "NO-GO" signal is set so that the meter reader is informed that proper communications have not been achieved between the present invention and the remote meter M'. This is illustrated by block F8. Then "NO-GO" signal can be a light on the front panel of the portable meter reading apparatus. After informing the meter reader that a "NO-GO" situation exists, the present invention waits for a key depression as shown in block F9. In a preferred embodiment of the present invention, the two acceptable responses from the meter reader are depressions of either the REPEAT or the RESET key.

Figure 8:
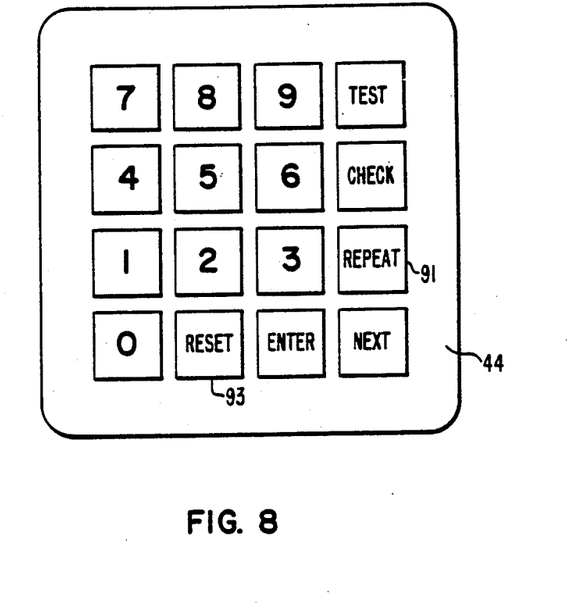
FIG. 8 illustrates the keyboard of the present invention that is used to enter commands for transmission to an inaccessible electric meter.

Turning now to FIG. 8, the keyboard 44 is shown in greater detail than above. The REPEAT key 91 and the RESET key 93 are included in a matrix of keys that also comprise the numerals from 0 to 9. Although, as described above, other functions can be provided in the present invention, typical applications would include the repeat key 91, the reset key 93, and the numeric keys. The test key, shown in FIG. 8, can be used to inform the microprocessor that the unique address has been entered and the read process (i.e. F2) should begin. At the particular point in the flowchart where the microprocessor is waiting for a key depression, at block F9, a depression of the RESET key 93 would cause the program to go to point A and begin the entire procedure over again, including the entry of the unique address on the keyboard 44. If the REPEAT key is depressed, the microprocessor would again formulate and send an address request to the inaccessible meter M'.

If the received unique address matches the transmitted unique address exactly, the microprocessor proceeds to point C of the flowchart in FIG. 7 and sends a command that instructs the inaccessible meter M' to transmit its energy consumption information back to the receiver of the present invention. This is illustrated by block F10. At block F11, the microprocessor waits for a response from the meter M'. It should be understood that block F11 actually comprises the necessary logic to compare the unique address of any incoming message to the unique address of the meter M'. In order to simplify the flowchart of FIG. 7, this detailed logic is not included in block F11. When an incoming message with the proper unique address is received, the microprocessor reads the incoming information in order to obtain the meter disc revolutions of the inaccessible meter M'. This is shown at block F12 of the flowchart. Since most meters with transceivers only store disc revolutions, this value must be converted to usable units. At block F13, the disc revolutions are converted to kilowatt-hours by multiplication of a suitable constant. After converting the disc revolutions to kilowatt-hours, the resulting kilowatt-hour value is displayed on display 46, as indicated by block F14. After this meter reading operation is complete, the microprocessor waits, at block F15, for a subsequent key depression. If the RESET key 93 is depressed, the microprocessor returns to point A and repeats the entire operation, including the entry of the unique address. If, however, the REPEAT key is depressed, the microprocessor returns to point C and retransmits a command message to the inaccessible meter M' that requests its subsequent transmission of energy consumption data.

In order to describe the present invention in greater detail, an exemplary meter reading operation will be discussed. A meter reader would carry the present invention during the periodic meter reading trips. If a particular meter is easily accessible, the meter reader would perform the normal manual reading of the meter register and record the cumulative energy consumption value in a ledger that will be returned to the utility for billing calculations. If an inaccessible meter is encountered, the present invention will be used to access the electrical energy consumption information of that meter. It should be understood that use of the present invention presupposes that the inaccessible meter has been previously equipped with a transceiver capable of communicating on the power line system. The meter reader then would go to an accessible location of the power line system and connect the connector of the present invention to that location of a power line conductor. The connection of the present invention to the power line conductor can be accomplished at any one of the number of locations, depending on convenience. For example, the distribution transformer T', which is typically on a utility pole proximate the inaccessible meter M', can be provided with a conventional receptacle or other connection device that can be associated with the connector of the present invention. Such a receptacle would normally be placed high on the utility pole or provided with a tamperproof enclosure, for reasons of safety. Alternatively, the present invention can be connected in signal communication with the ground wire of the transformer T' which extends down along the utility pole. This type of connection can be accomplished, as described above, by magnetic coupling of the present invention to the ground wire.

Alternatively, the meter reader could go to a neighboring residence and connect the present invention directly to an outside receptacle of the neighboring residence. This would place the present invention in signal communication with the power line system associated with the secondary S' of the distribution transformer T' and would enable the operator to communicate directly to the remote and inaccessible meter M'.

After connecting the present invention to the power line conductor, the meter reader would then enter a unique address associated with the inaccessible meter M'. Furthermore, appropriate instructions would be entered, via the keyboard 44, that would enable the microprocessor 28 to formulate a command message to be sent to the remote meter M'. In the most likely circumstance, the command message would contain the unique address of the inaccessible meter M' along with appropriate commands instructing the remote device to transmit its stored energy consumption information back to the present invention.

When the remote meter M' receives the command message, it is demodulated and translated. In response to this command, the remote meter M' would transmit a message back to the present invention that contains the requested information. The remote device located at the inaccessible meter M' can be any one of a number of known transceivers capable of power line communication.

When the message is transmitted by the remote meter M', it is received by the receiver circuitry of the present invention, passed through a high pass filter, hard limited and demodulated by the present invention. After demodulation, the incoming baseband data message is translated from a numeric code to a useable format and converted to units which are meaningful to the meter reader. These units, such as kilowatthours, are then displayed on the display 46 so that the meter reader can record the information for later transmittal to the electrical utility for purposes of calculating the customers' bill.

By utilizing the present invention, an electric utility can provide a method for reading inaccessible meters without the requirement of providing an entire power line connumication system that would necessitate central station hardware capable of transmitting and receiving signals, remote transceivers located at each consumer's residence and a number of repeaters and other communication hardware. Although the present invention has been described in significant detail and specificity, it should be understood that alternative embodiments of the present invention are within its scope.

What I claim is:

1. A meter reading apparatus, comprising:
   means for manually entering a command message into said meter reading apparatus;
   means for formulating a baseband signal representative of said manually entered command message;
   means for modulating a carrier signal with said baseband signal;
   means for connecting said meter reading apparatus to a conductor of a power line at a location that is remote from a meter that is to be read, said connecting means having an opening therein shaped to receive said conductor of said power line;
   means operatively associated with said connecting means for injecting said modulated carrier signal onto said power line conductor;
   a receiver circuit that is connectable in signal communication with said power line conductor, said receiver circuit comprising a high pass filter and means for hard limiting sinusoidal signals received from said power line conductor;
   a demodulator connected in signal communication with said receiver circuit, said demodulator being configured to demodulate said sinusoidal signals to provide an incoming baseband signal;
   means for translating said incoming baseband signal into a value representative of energy consumption;
   means for displaying said representative value;
   portable means for providing DC power for said meter reading apparatus; and
   portable means for housing said meter reading apparatus.

2. The apparatus of claim 1, wherein:
said portable providing means is a battery.

3. The apparatus of claim 1, wherein:
said command signal is a message directed to a unique remote meter to command said unique remote meter to transmit information relating to its stored energy consumption information.

4. The apparatus of claim 1, wherein:
said entering means is a keyboard.

5. The apparatus of claim 1, wherein:
said demodulator and said translating means are both program portions contained in a microprocessor.

* * * * *